United States Patent
Senkal et al.

(10) Patent No.: US 10,794,702 B2
(45) Date of Patent: Oct. 6, 2020

(54) ON-CHIP GAP MEASUREMENT

(71) Applicant: INVENSENSE, INC., San Jose, CA (US)

(72) Inventors: Doruk Senkal, San Jose, CA (US); Houri Johari-Galle, San Jose, CA (US); Joseph Seeger, Menlo Park, CA (US)

(73) Assignee: INVENSENSE, INC., San Jose, CA (US)

( * ) Notice: Subject to any disclaimer, the term of this patent is extended or adjusted under 35 U.S.C. 154(b) by 153 days.

(21) Appl. No.: 16/130,695

(22) Filed: Sep. 13, 2018

(65) Prior Publication Data

US 2019/0178645 A1    Jun. 13, 2019

Related U.S. Application Data

(60) Provisional application No. 62/598,349, filed on Dec. 13, 2017.

(51) Int. Cl.
| | |
|---|---|
| *G01C 19/5712* | (2012.01) |
| *G01C 19/5776* | (2012.01) |
| *G01C 19/5726* | (2012.01) |
| *G01C 25/00* | (2006.01) |

(52) U.S. Cl.
CPC ..... *G01C 19/5712* (2013.01); *G01C 19/5726* (2013.01); *G01C 19/5776* (2013.01); *G01C 25/005* (2013.01)

(58) Field of Classification Search
CPC ............ G01C 19/5712; G01C 19/5726; G01C 19/5776
See application file for complete search history.

(56) References Cited

U.S. PATENT DOCUMENTS

| | | | | |
|---|---|---|---|---|
| 8,453,504 | B1* | 6/2013 | Mao | G01C 19/574 |
| | | | | 73/504.14 |
| 9,896,327 | B2 | 2/2018 | Thompson | |
| 2012/0118062 | A1 | 5/2012 | Guenthner | |
| 2012/0293907 | A1* | 11/2012 | Jin | G01P 15/125 |
| | | | | 361/280 |

(Continued)

FOREIGN PATENT DOCUMENTS

| | | |
|---|---|---|
| EP | 2884229 | 6/2015 |
| JP | H11237247 | 8/1999 |

(Continued)

OTHER PUBLICATIONS

PCT International Search Report and Written Opinion for International Application No. PCT/US2018/055221, dated Jan. 31, 2019 (14 pages).

*Primary Examiner* — Helen C Kwok

(74) *Attorney, Agent, or Firm* — Haley Guiliano LLP; Joshua Van Hoven; Maryam Imam

(57) ABSTRACT

A MEMS gyroscope includes a proof mass of a suspended spring mass system that is driven at a drive frequency. The proof mass moves relative to a sense electrode such that an overlap of the proof mass and sense electrode changes during the drive motion. A Coriolis force causes the proof mass to move relative to the sense electrode. The overlap and the movement due to the Coriolis force are sensed, and angular velocity is determined based on the magnitude of a signal generated due to a change in overlap and the Coriolis force.

19 Claims, 6 Drawing Sheets

(56) References Cited

U.S. PATENT DOCUMENTS

| | | |
|---|---|---|
| 2012/0304770 A1* | 12/2012 | Kim ........................ G01P 15/08 |
| | | 73/514.35 |
| 2013/0180333 A1* | 7/2013 | Swanson ............ G01C 19/5719 |
| | | 73/504.12 |
| 2013/0247669 A1* | 9/2013 | Swanson ............... G01P 15/125 |
| | | 73/514.38 |
| 2017/0122825 A1 | 5/2017 | Naumann |
| 2017/0138734 A1* | 5/2017 | Shao .................. G01C 19/5733 |
| 2018/0231384 A1* | 8/2018 | Johnson ............. G01C 19/5712 |
| 2018/0252526 A1* | 9/2018 | Geisberger ......... G01C 19/5726 |
| 2019/0033075 A1* | 1/2019 | Wu .................... G01C 19/5762 |

FOREIGN PATENT DOCUMENTS

| | | |
|---|---|---|
| JP | 3212804 | 9/2001 |
| JP | 3212804 B2 * | 9/2001 |

\* cited by examiner

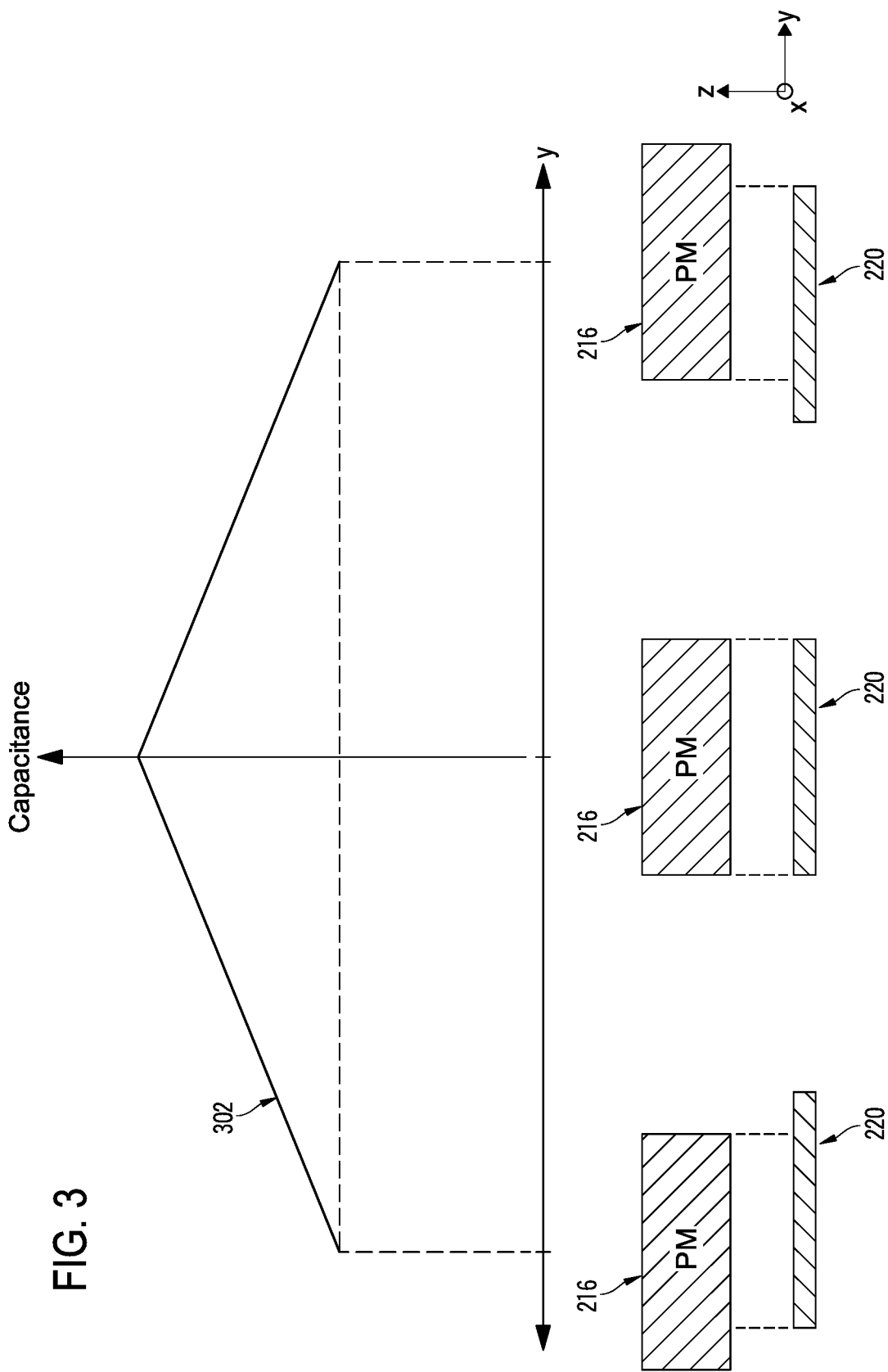

ON-CHIP GAP MEASUREMENT

This application claims the benefit of U.S. Provisional Application No. 62/598,349, filed Dec. 13, 2017, which is hereby incorporated by reference herein in its entirety.

BACKGROUND

Numerous items such as smart phones, smart watches, tablets, automobiles, aerial drones, appliances, aircraft, exercise aids, and game controllers may utilize motion sensors during their operation. In many applications, various types of motion sensors such as accelerometers and gyroscopes may be analyzed independently or together in order to determine varied information for particular applications. For example, gyroscopes and accelerometers may be used in gaming applications (e.g., smart phones or game controllers) to capture complex movements by a user, drones and other aircraft may determine orientation based on gyroscope measurements (e.g., roll, pitch, and yaw), and vehicles may utilize measurements for determining direction (e.g., for dead reckoning) and safety (e.g., for recognizing skid or roll-over conditions).

Motion sensors such as accelerometers and gyroscopes may be manufactured as microelectromechanical (MEMS) sensors that are fabricated using semiconductor manufacturing techniques. A MEMS sensor may include movable proof masses that can respond to forces such as linear acceleration (e.g., for MEMS accelerometers), angular velocity (e.g., for MEMS gyroscopes), and magnetic field. The operation of these forces on the movable proof masses may be measured based on the movement of the proof masses in response to the forces. In some implementations, this movement is measured based on distance between the movable proof masses and electrodes, which form capacitors for sensing the movement.

In the case of a MEMS gyroscope, certain micromechanical components are caused to vibrate at a drive frequency. A number of components are often physically connected by numerous springs, each of which is designed to enable motion in certain directions while restricting movement in other directions. When a mass that is vibrating at the drive frequency experiences a Coriolis force along an axis that is perpendicular to the drive axis as a result of rotation, it will move along this Coriolis axis (e.g., a "sense" or "Coriolis" axis) if springs or other structural features do not prevent such a motion. This Coriolis force is proportional to the angular velocity of the rotation. This motion may then be sensed based on the motion of the mass (or in some applications, an additional proof mass connected by the additional springs) in the sense direction, e.g., based on the relative distance between the moving sense mass and fixed components of the gyroscope.

Over time, physical or electrical attributes of components in the MEMS sensory may vary, such as a change in stiffness of the springs, a change in voltage driving the proof masses, a change in a capacitive gap between a proof mass and an electrode, a drift in circuit gain, etc. When these changes are not properly accounted for in the sensor output, measurement errors may occur. Additionally, a MEMS sensor may be manufactured from a number of layers using semiconductor manufacturing techniques such that the relative distance between components of the MEMS sensor varies based on manufacturing tolerances and similar factors. Environmental conditions and end-use environments may affect components of the MEMS sensor. These and other factors may cause the position of components within the MEMS sensor to depart from ideal or designed locations within the sensor and may also contribute to measurement errors.

SUMMARY OF THE INVENTION

In an embodiment of the present disclosure, an exemplary microelectromechanical (MEMS) sensor for measuring a force comprises a proof mass located within a MEMS layer of the MEMS sensor, the proof mass comprising a proof mass planar surface. The exemplary MEMS sensor may comprise an electrode comprising an electrode planar surface to form a first capacitor with the proof mass, where the electrode planar surface faces the proof mass planar surface to form a first capacitor. The proof mass may be caused to oscillate according to a drive motion, where an overlap of the facing portions of the electrode planar surface and the proof mass planar surface changes during the drive motion. The exemplary MEMS sensor may additionally comprise processing circuitry configured to receive a sense signal from the first capacitor. Based on the sense signal, the processing circuitry may measure a magnitude of a signal generated due to the change in the overlap between the proof mass and the electrode, and modify a calculation of the force based on the magnitude of the signal. For example, the exemplary MEMS sensor may estimate, based on the magnitude of the signal generated due to the change in overlap between the proof mass and the electrode, a drive displacement of the proof mass, a voltage of the proof mass, a capacitive gap between the proof mass and the electrode, and/or a circuit gain of an amplifier associated with the MEMS sensor, and may, based on the estimate, modify a calculation of the force measured by the MEMS sensor.

In an embodiment of the present disclosure, an exemplary microelectromechanical (MEMS) gyroscope comprises a substrate layer, where the substrate layer comprises an electrode on an upper surface of the substrate layer. The exemplary MEMS gyroscope may also comprise a MEMS layer, where the MEMS layer comprises a proof mass, and where a lower surface of the proof mass faces the electrode to form a capacitor. The proof mass may be caused to oscillate according to a drive motion, where an overlap of the facing portions of the electrode and the proof mass changes during the drive motion. The exemplary MEMS gyroscope may also comprise processing circuitry configured to receive a sense signal from the capacitor, measure the magnitude of a signal generated based on the change in the overlap from the sense signal, receive a force signal based on a movement of the proof mass orthogonal to the drive motion, and calculate a force based on the force signal and the magnitude of the signal generated based on the change in the overlap (e.g., by estimating sensor parameters based on the magnitude of the signal and modifying the calculation of the force based on the estimated sensor parameters).

In an embodiment of the present disclosure a microelectromechanical (MEMS) sensor determines a force by causing a proof mass to oscillate according to a drive motion, where the proof mass located within a MEMS layer of the MEMS sensor and comprises a proof mass planar surface. The MEMS sensor may comprise an electrode comprising an electrode planar surface that faces the proof mass planar surface to form a first capacitor. An overlap of the facing portions of the electrode planar surface and the proof mass planar surface may change during the drive motion. The MEMS sensor may receive a sense signal from the first capacitor, measure the change in the overlap based on the sense signal, and modify a calculation of the force based on the change in the overlap.

BRIEF DESCRIPTION OF THE DRAWINGS

The above and other features of the present disclosure, its nature and various advantages will be more apparent upon consideration of the following detailed description, taken in conjunction with the accompanying drawings in which:

FIG. 3 shows an illustrative sensor output during a drive motion in accordance with some embodiments of the present disclosure;

DETAILED DESCRIPTION

Figure 1:
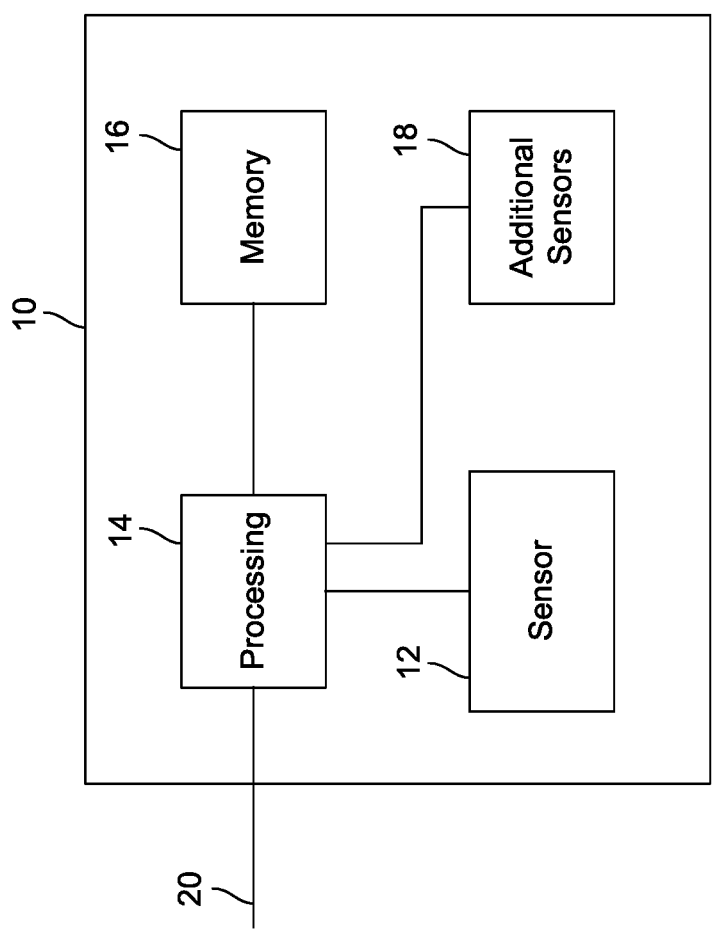
FIG. 1 shows an illustrative motion sensing system in accordance with an embodiment of the present disclosure.

An exemplary MEMS sensor may include a substrate and a MEMS layer. Electrodes may be formed on a surface of the substrate and the MEMS layer may be designed to be located parallel to the top surface of the electrodes and the substrate. The MEMS layer includes anchor points that are fixed within the MEMS sensor, such as by bonding to a frame of the MEMS layer or to the substrate and/or a cap layer. Movable components of the MEMS sensor may be patterned within the MEMS layer to form springs and masses that are suspended from the anchors. Collectively, these suspended components may form a suspended spring-mass system.

Active components of the movable components of the suspended spring-mass system may be designed to move in-plane (e.g., within the MEMS layer) and out of plane (e.g., out of the MEMS layer, towards or away from the substrate) in response to applied drive forces, sensed forces, or both. Measurement of a sensed parameter such as linear acceleration, angular velocity, or magnetic field may be based on the proper movement of these active components within the MEMS layer and relative to other portions of the MEMS sensor such as the electrodes located on the substrate. If the active components are not properly located within the MEMS layer relative to the electrodes located on the substrate, the sensor may not function properly and sensed values may be scaled improperly.

The active components may be displaced from the electrodes located on the substrate for a variety of causes, such as manufacturing tolerances, end-use physical and/or environmental conditions (e.g., temperature), wear on the internal components, variations in electrical properties, external stresses, etc. The MEMS sensor described herein may perform a self-calibration to account for sensor signal output variations. For example, the exemplary MEMS sensor may utilize the drive motion of a proof mass in a MEMS gyroscope and the associated overlap change with sense electrodes to estimate the gap variation of the MEMS gyroscope. The exemplary MEMS sensor may utilize the estimate of the gap variation to calibrate a sensitivity of the MEMS sensor.

In some embodiments, an exemplary MEMS gyroscope may extract a test signal from a signal output from a sense electrode. For example, the sense electrode may be sized relative to the driven proof mass, such that an area of overlap between the proof mass and an electrode has both increasing and decreasing portions twice during each period of the drive frequency, resulting in a measured change in capacitance due to overlap that has twice the frequency as the underlying drive frequency. An output signal from the sense electrode may comprise a multiplexed signal including a signal at the drive frequency that is generated due to the Coriolis force and a signal at two times the drive frequency that is generated due to the change in overlap. The exemplary MEMS gyroscope may demultiplex the signal to extract the signal based on the measurement of the Coriolis force and the test signal generated based on the overlap change. The exemplary MEMS sensor may correct a calculated force for any variations in parameters of the MEMS sensor (e.g., correct for a variation in the capacitive gap) based on the test signal (e.g., by estimating a change in the capacitive gap based on the test signal).

In some embodiments, an exemplary MEMS gyroscope may generate the test signal from a supplemental electrode. For example, the MEMS gyroscope may comprise an additional, test electrode, supplemental to the sense electrode. The test electrode may be located in close proximity to a sense electrode such that any changes in parameters of the sense electrode may be approximated by changes measured at the test electrode (e.g., any changes in capacitive gap between a proof mass and the sense electrode due to external stresses may be approximately the same as any changes in capacitive gap between the proof mass and the test electrode). The test electrode may be configured such that an amount of overlap of the proof mass over the test electrode varies over the period of the drive frequency. A signal generated by the test electrode may vary based on an overlap change between the proof mass and the test electrode. The signal generated by the test electrode may be used by the MEMS gyroscope to determine any variance in properties of the MEMS sensor and may be used to correct for the variance (e.g., the MEMS sensor may estimate a variance in the capacitive gap and may adjust a force calculation based on the estimated variance in capacitive gap).

The resulting test signal may be used to estimate a distance or gap between the proof mass and the substrate, i.e., not due to the sensed force, or other parameters of the MEMS gyroscope, such as drive displacement, proof mass voltage, and amplifier gain. The estimate of the gap may be used to modify the signal resulting from the sensed force, for example, by changing scaling factors associated with the sensed force or otherwise modifying the value of the force that is determined. In this manner, even if the gap between the proof mass and the substrate is different than an expected gap, or changes over time, the value of the sensed force may be compensated based on an actual measurement of the gap.

FIG. 1 depicts an exemplary motion sensing system 10 in accordance with some embodiments of the present disclosure. Although particular components are depicted in FIG. 1, it will be understood that other suitable combinations of sensors, processing components, memory, and other circuitry may be utilized as necessary for different applications and systems. In an embodiment as described herein, the motion sensing system may include at least a MEMS gyroscope 12 and supporting circuitry, such as processing circuitry 14 and memory 16. In some embodiments, one or more additional sensors 18 (e.g., additional MEMS gyroscopes, MEMS accelerometers, MEMS microphones, MEMS pressure sensors, and a compass) may be included within the motion processing system 10 to provide an integrated motion processing unit ("MPU") (e.g., including 3 axes of MEMS gyroscope sensing, 3 axes of MEMS accelerometer sensing, microphone, pressure sensor, and compass).

Processing circuitry 14 may include one or more components providing necessary processing based on the requirements of the motion processing system 10. In some embodiments, processing circuitry 14 may include hardware control logic that may be integrated within a chip of a sensor (e.g., on a substrate or cap of a MEMS gyroscope 12 or other sensor 18, or on an adjacent portion of a chip to the MEMS gyroscope 12 or other sensor 18) to control the operation of the MEMS gyroscope 12 or other sensors 18 and perform aspects of processing for the MEMS gyroscope 12 or other sensors 18. In some embodiments, the MEMS gyroscope 12 and other sensors 18 may include one or more registers that allow aspects of the operation of hardware control logic to be modified (e.g., by modifying a value of a register). In some embodiments, processing circuitry 14 may also include a processor such as a microprocessor that executes software instructions, e.g., that are stored in memory 16. The microprocessor may control the operation of the MEMS gyroscope 12 by interacting with the hardware control logic, and process signals received from MEMS gyroscope 12. The microprocessor may interact with other sensors in a similar manner.

Although in some embodiments (not depicted in FIG. 1), the MEMS gyroscope 12 or other sensors 18 may communicate directly with external circuitry (e.g., via a serial bus or direct connection to sensor outputs and control inputs), in an embodiment the processing circuitry 14 may process data received from the MEMS gyroscope 12 and other sensors 18 and communicate with external components via a communication interface 20 (e.g., a SPI or I2C bus, or in automotive applications, a controller area network (CAN) or Local Interconnect Network (LIN) bus). The processing circuitry 14 may convert signals received from the MEMS gyroscope 12 and other sensors 18 into appropriate measurement units (e.g., based on settings provided by other computing units communicating over the communication bus 20) and perform more complex processing to determine measurements such as orientation or Euler angles, and in some embodiments, to determine from sensor data whether a particular activity (e.g., walking, running, braking, skidding, rolling, etc.) is taking place.

In some embodiments, certain types of information may be determined based on data from multiple MEMS inertial sensors 12 and other sensors 18, in a process that may be referred to as sensor fusion. By combining information from a variety of sensors it may be possible to accurately determine information that is useful in a variety of applications, such as image stabilization, navigation systems, automotive controls and safety, dead reckoning, remote control and gaming devices, activity sensors, 3-dimensional cameras, industrial automation, and numerous other applications.

An exemplary MEMS gyroscope 12 may include one or more movable proof masses that are configured in a manner that permits the MEMS sensor to measure a desired force (e.g., linear acceleration, angular velocity, magnetic field, etc.) along an axis. In some embodiments, the one or more movable proof masses may be suspended from anchoring points, which may refer to any portion of the MEMS sensor which is fixed, such as an anchor that extends from a layer (e.g., a CMOS layer) that is parallel to the MEMS layer of the device, a frame of the MEMS layer of the device, or any other suitable portion of the MEMS device that is fixed relative to the movable proof masses. The proof masses may be arranged in a manner such that they move in response to measured force. The movement of the proof masses relative to a fixed surface (e.g., a fixed sense electrode extending into the MEMS layer or located parallel to the movable mass on the substrate) in response to the measured force is measured and scaled to determine the desired inertial parameter.

Figure 2:
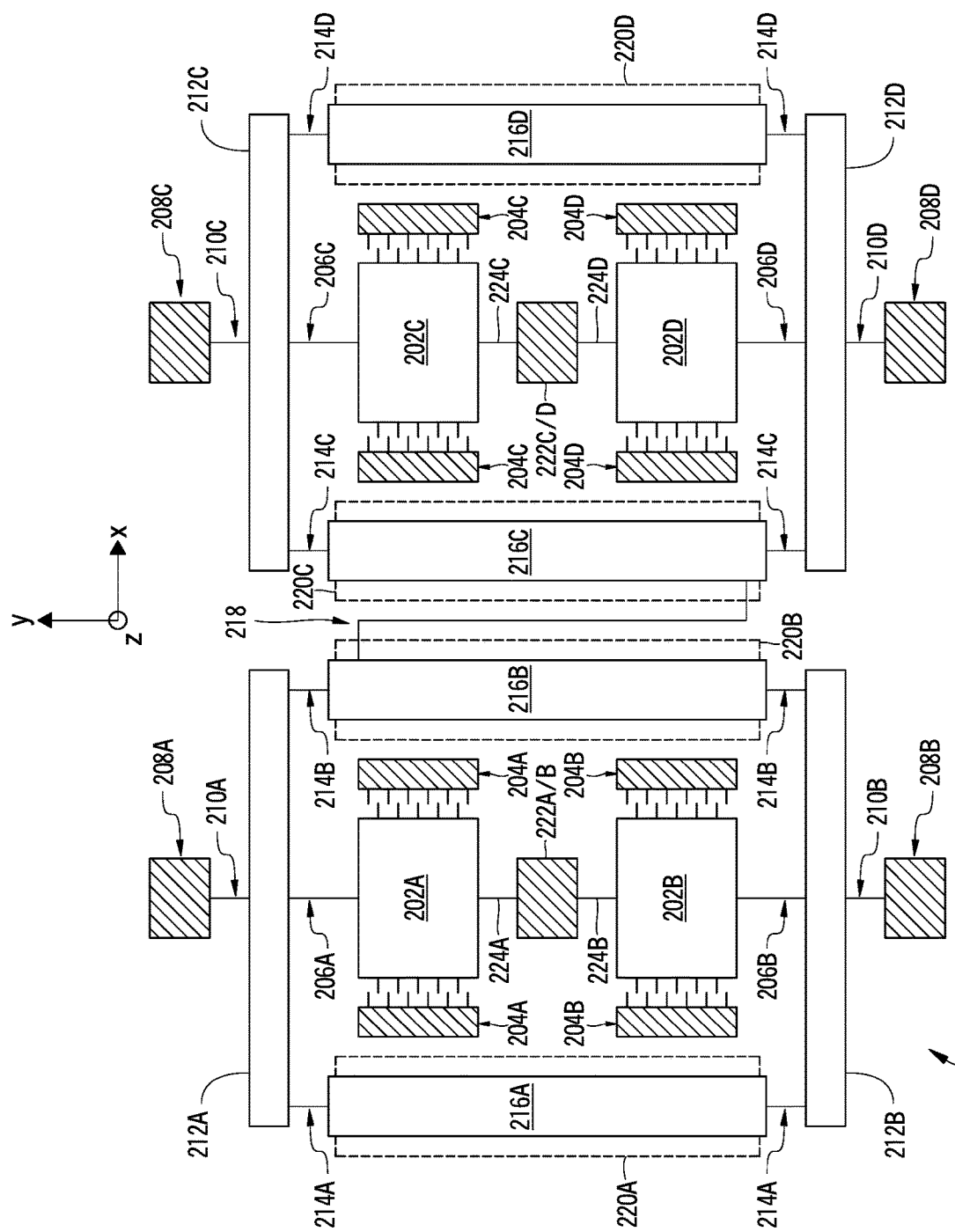
FIG. 2 shows an illustrative sensor design in accordance with some embodiments of the present disclosure.

FIG. 2 shows an illustrative MEMS gyroscope design in accordance with an embodiment of the present disclosure. Although the gyroscope of FIG. 2 may include any suitable components, in an exemplary embodiment the gyroscope of FIG. 2 may include drive masses 202a, 202b, 202c, and 202d; lever anchors 208a, 208b, 208c, and 208d; lever arms 212a, 212b, 212c, and 212d; proof masses 216a, 216b, 216c, and 216d; drive anchors 222a/b and 222c/d; and a number of springs and actuators as described herein. Each of these components may be located (e.g., suspended) within a MEMS device plane that defines an x-axis and y-axis in the plane, and a z-axis perpendicular to the plane. A substrate may be located in a plane that is parallel to the MEMS device plane (e.g., below the MEMS device plane), and in some embodiments, may include sensing elements (e.g., electrodes 220a, 220b, 220c, and 220d), CMOS circuitry within the substrate layer, and a variety of anchored components that extend from the substrate into the MEMS device plane to provide anchors, actuators, and other components for suspending and operating the MEMS gyroscope.

Each of the drive masses 202a, 202b, 202c, and 202d may have a respective drive motion imparted on the drive mass in a respective drive direction, as described herein. Although any suitable actuation method may be used in accordance with the present disclosure, in an embodiment the drive masses may be caused to move in the drive direction by respective electrostatic actuators 204a, 204b, 204c, and 204d. In the exemplary embodiment depicted in FIG. 2, the electrostatic actuators 204a, 204b, 204c, and 204d may be anchored to the substrate and extend therefrom into the MEMS device plane. The electrostatic actuators may be located relative to the drive masses in a manner such that drive masses (which are movable within the MEMS device plane) are caused to oscillate within the MEMS device plane in a drive direction along the x-axis. Although any suitable electrostatic actuation may be used in accordance with the present disclosure, in an embodiment each drive mass and its associated actuators may form a comb drive, with interdigitated comb fingers extending from each drive mass and its associated actuators. Drive masses 202a, 202b, 202c, and 202d may be each be suspended from respective anchors 222a/b and 222c/d by respective springs 224a, 224b, 224c, and 224d, which are compliant along a drive axis (e.g., the x-axis) and rigid along other axes, in order to facilitate movement of the drive masses along the drive axis.

Each of the drive masses may be coupled to a respective lever arm via a respective spring (e.g., such that drive mass 202a is coupled to lever arm 212a via spring 206a, drive mass 202b is coupled to lever arm 212b via spring 206b, drive mass 202c is coupled to lever arm 212c via spring 206c, and drive mass 202d is coupled to lever arm 212d via spring 206d). In an embodiment, each of springs 206a, 206b, 206c, and 206d may comprise one or more springs and/or masses that are coupled and configured such that the drive motion of the drive masses causes a rotation of a respective lever arm. Although the springs 206a, 206b, 206c, and 206d may perform this function in a variety of manners, in an embodiment the springs may be torsionally compliant to allow movement of the lever arm and proof masses out of the MEMS device plane (e.g., in the z-axis direction) in response to a Coriolis force due to rotation about the measured axis (e.g., the x-axis). In an embodiment, although the spring may be partially compliant along the drive axis, the spring may have sufficient width (e.g., along the x-axis axis) such that each lever arm is pulled along the drive axis in response to the respective motion of its associated drive mass.

In an embodiment, each of the lever arms may translate the drive motion applied along a first axis (e.g., the x-axis in FIG. 2) to a sense drive motion along a perpendicular axis, by being anchored and suspended in a manner that results in an in-plane rotation within the MEMS device plane. Although a suitable lever arm can include multiple interconnected masses and springs suspended in a suitable manner to translate the drive motion to a perpendicular sense drive motion, in an embodiment each lever arm may be suspended from a respective anchor by a spring located at the approximate center of the lever arm and along a shared axis with the respective spring coupled to the drive mass when the gyroscope is not being driven (e.g. as depicted in FIG. 2). Thus, spring 210a may share an axis with spring 206a and suspend lever arm 212a from anchor 208a, spring 210b may share an axis with spring 206b and suspend lever arm 212b from anchor 208b, spring 210c may share an axis with spring 206c and suspend lever arm 212c from anchor 208c, and spring 210d may share an axis with spring 206d and suspend lever arm 212d from anchor 208d. The respective coupling of the lever arms to both the springs and the anchors (via the springs) may result in each lever arm rotating about its anchor in the MEMS device plane in response to a drive motion imparted by the drive masses via the springs. The rotation of each lever arm about each respective anchor may result in a motion at the end of each lever arm that is along the y-axis in the MEMS device plane.

Each lever arm may be coupled to one or more proof masses via one or more couplings. In an embodiment, each lever arm may be coupled to a proof mass at each end of the lever arm, such that in the embodiment of FIG. 2 lever arm 212a is coupled to proof mass 216a via proof mass spring 214a and to proof mass 216b via proof mass spring 214b, lever arm 212b is coupled to proof mass 216a via proof mass spring 214a and to proof mass 216b via proof mass spring 214b, lever arm 212c is coupled to proof mass 216c via proof mass spring 214c and to proof mass 216d via proof mass spring 214d, and lever arm 212d is coupled to proof mass 216c via proof mass spring 214c and to proof mass 216d via proof mass spring 214d. While each drive motion from each drive mass may be decoupled from the other drive masses, in an embodiment the drive motions may be coordinated such that the lever arms collectively cause each proof mass to move in the positive or negative y-direction, based on whether each pair of lever arms coupled to each proof mass are collectively rotating in a clockwise or counter-clockwise manner. The drive masses may be driven at a drive frequency, such that the lever arms and proof masses are driven to oscillate (rotationally for the lever arms, linearly for the proof masses) at the drive frequency.

In an embodiment, the electrodes 220A-220D and proof masses 216A may be sized such that the drive motion of the proof masses along the y-axis changes the overlap of the capacitor formed by each electrode/proof mass pair. For example, in a resting position as depicted in FIG. 2, each proof mass may completely overlap its associated electrode (e.g., proof mass 216A may completely overlap electrode 220A, proof mass 216B may completely overlap electrode 220B, proof mass 216C may completely overlap electrode 220C, and proof mass 216D may completely overlap electrode 220D). As the drive motion moves in each direction, the displacement of the proof mass in that direction may be such that the proof mass no longer completely overlaps the underlying electrode, e.g., such that during a portion of a drive motion in the negative y-direction the positive y-direction portion of the electrode may not be overlapped by its associated proof mass, and vice versa.

In some embodiments (not depicted in FIG. 2) a gap sense or test electrode may be separate from the sense electrode, and may be located and sized such that particular patterns in change in overlap may be sensed by the test electrodes such that the signal generated by the test electrode may be used to calibrate a measurement by the sense electrode. In one non-limiting embodiment, a test electrode may overlap an end portion of a proof mass while the proof mass is at rest. The test electrode may be located such that during one portion of the drive motion (e.g., one of the positive or negative y-direction motion) the overlap of the test electrode and the proof mass increases, while in the other portion of the drive motion, the overlap of the test electrode and the proof mass decreases. In another exemplary embodiment, test electrodes may be located at each end of a single proof mass and may be similarly sized and located, such that as overlap of the proof mass with a first of the test electrodes decreases the overlap of the other test electrode increases.

As the proof masses are driven along the y-axis, they may experience a Coriolis force as the result of a rotation of the sensor about an axis that is perpendicular to the sense drive axis and in which movement of the proof masses is permitted by the gyroscope construction in configuration. In the exemplary gyroscope design of FIG. 2, the proof masses may experience an out-of-plane Coriolis force (e.g., along the z-axis) in response to a rotation about the measured axis (e.g., the x-axis), with the direction of the Coriolis force based on the direction of the sense drive motion (e.g., the y-axis) and the direction of rotation about the measured axis (e.g., the x-axis). The movement of the proof masses out of the MEMS device plane may be sensed in any suitable manner, such as electrostatic, piezoelectric, or optical sensing. In an exemplary embodiment of electrostatic sensing as depicted in FIG. 2, one or more electrodes may be located in parallel to the proof masses (e.g., on the substrate below the proof masses) to form a capacitor with each of the proof masses (e.g., electrode 220a forms a capacitor with proof mass 216a, electrode 220b forms a capacitor with proof mass 216b, electrode 220c forms a capacitor with proof mass 216c, and electrode 220d forms a capacitor with proof mass 216d). The capacitance of each of the proof masses may change based on the relative distance between each proof mass and its associated sense electrodes. In the exemplary embodiment of FIG. 2, the changes in capacitance may be sensed differentially. A movement of one or more masses out-of-plane away from the substrate may correspond to a movement of another of the one or more proof masses out-of-plane towards the substrate.

The exemplary gyroscope of FIG. 2 may include two similar gyroscope portions, each including a similar number and configuration of drive masses, lever arms, and proof masses. Although two drive masses, lever arms, and proof masses are depicted in FIG. 2, it will be understood that other numbers and configurations of proof masses may be possible in other embodiments. In the exemplary embodiment of FIG. 2, each gyroscope portion includes a respective drive system (e.g., including two drive masses, two first springs, two lever arms, and two additional springs) and a respective sense system (e.g., including two sense springs and two proof masses). A coupling spring 218 may couple the two gyroscope portions together, such that the drive sense motion and Coriolis response of the gyroscope portions are coupled, resulting in proof masses 216b and 216c moving together in anti-phase to proof masses 216a and 216d.

As described herein, drive masses 202a-202d may be driven to oscillate along the x-axis with two of the masses moving in anti-phase from the other two masses. This drive motion results in lever arms 202a and 202b rotating clockwise and counterclockwise in unison while lever arms 202c and 202d similarly rotate in unison. These rotations of the lever arms in turn cause proof mass 216a to move in anti-phase to proof mass 216b and proof mass 216c to move in anti-phase to proof mass 216d. As long as the suspended spring-mass system is properly located parallel to the substrate, the motion of all of the drive masses, lever arms, and proof masses is within the MEMS layer, such that none of these components move relative to the substrate or substrate electrodes during operation in the absence of an external force. The drive and sense motion of an exemplary MEMS sensor are described in further detail in U.S. patent application Ser. No. 15/232,463, entitled OUT OF PLANE SENSING GYROSCOPE ROBUST TO EXTERNAL ACCELERATION AND ROTATION and filed Apr. 4, 2017, which is herein in incorporated by reference in its entirety.

The determination of the sensed angular velocity may be based on the change in z-axis distance between proof masses and electrodes, as described herein. The value of the capacitance of each capacitor changes based on the movement due to the Coriolis force. However, the value of the capacitance depends not only on the relative change in distance due to Coriolis force but also the absolute distance, e.g., the gap while the proof mass is at rest or not experiencing a Coriolis force. As described herein, a signal generated based on the change in overlap between the proof mass and the electrode may be used to estimate this gap and/or compensate for the sensed force.

FIG. 3 shows an illustrative sensor output during a drive motion in accordance with some embodiments of the present disclosure. In FIG. 3, proof mass 216 is depicted as having a same length along the drive axis (y-axis) as electrode 220, although in other embodiments the relative sizes may be modified as described herein. Sensor output 302 depicts a measured capacitance of the capacitor formed between proof mass 216 and electrode 220 as depicted on a graph having the y-axis position of proof mass 216 along the horizontal axis and Capacitance along the vertical axis. The movement of proof mass 216 is shown over the course of the drive motion where proof mass 216 experiences a displacement along the negative y-axis direction that changes the overlap with the electrode 220 and such that proof mass 216 experiences a displacement along the positive y-axis direction that also changes the overlap with the electrode 220.

As discussed above with respect to FIG. 2, proof mass 216 may move in along the Y axis in response to a drive force causing lever arms 212A, 212B, 212C, and/or 212D to rotate clockwise or counterclockwise about the z axis. Starting from zero y-axis displacement, a drive force may cause proof mass 216 to move within the MEMS layer along the negative y-axis direction (e.g., due to a drive force causing a rotation of one of leaver arms 212A, 212B, 212C, 212D, etc. When proof mass 216 experiences zero y-axis displacement (e.g., at a beginning of the drive cycle where proof mass 216 is starting to be driven from rest, in the middle of the drive cycle where proof mass has already experienced maximum negative y-axis displacement or maximum positive y-axis displacement in the cycle, or at an end of the drive cycle where proof mass 216 has experienced both maximum positive y-axis displacement and maximum negative y-axis displacement) a bottom surface of proof mass 216 in the plane formed by the x-y axis maximally overlaps with a top surface of electrode 220 in the plane formed by the x-y axis. Because proof mass 216 and electrode 220 achieve maximum overlap at zero displacement along the y-axis, electrode 220 will detect a greatest capacitance between electrode 220 and proof mass 216 at when proof mass 216 experiences zero displacement along the y-axis with respect to electrode 220 within the drive cycle.

As proof mass 216 moves along the y-axis is in the negative y-axis direction from a rest position having zero displacement along the y-axis, an edge of proof mass 216 in the negative y-axis direction may overlap and pass an edge of electrode 220 in the negative y-axis direction, resulting in a decrease in capacitance measured by electrode 220. For example, as proof mass 216 moves along the y-axis in the negative direction and passes an edge of electrode 220 in the negative y-axis direction, an area of overlap between a bottom surface of proof mass 216 (e.g., a surface of proof mass 216 in the x-y plane along the negative z-axis direction) and a top surface of electrode 220 (e.g., a surface of electrode 220 in the x-y plane along the positive z-axis direction). The resultant decrease in the area of overlap between the two surfaces causes the capacitance to decrease linearly with respect to a position of proof mass 216 along the y axis.

Similarly, as proof mass 216 moves along the y-axis in the positive y-axis direction (e.g., from a point of greatest negative y-axis displacement to a point of greatest positive y-axis displacement) the capacitance measured between proof mass 216 and electrode 220 will increase as the area of overlap between proof mass 216 increases and will begin decreasing as the area of overlap between proof mass 216 and electrode 220 decreases. For example, as proof mass 216 is driven from zero y-axis displacement to maximum y-axis displacement, an edge of proof mass 216 in the positive y-axis direction will pass an edge of electrode 220 in the positive y-axis direction, resulting in proof mass 216 no longer completely overlapping with electrode 220. Due to the linearly decrease in the area of overlap as proof mass 216 is driven along the positive y-axis direction, electrode 220 will measure a linearly reducing capacitance between electrode 216 and 220 until proof mass 216 reaches a point of maximal positive y-axis displacement.

Due to the alignment of proof mass 216 with electrode 220 (e.g., complete overlap of proof mass 216 with electrode 220 when proof mass 216 is not being driven such that a middle of proof mass 216 aligns with a middle of electrode 220 along the y-axis direction) and the symmetric drive force causing the proof mass to experience an equal amount of displacement along the positive y-axis direction and along the negative y-axis direction, the capacitance measured by electrode 220 will be two times the drive frequency. For example, during one driven cycle, proof mass 216 may begin at zero y-axis displacement where electrode 220 measures a greatest capacitance (e.g., due to a greatest amount of overlap between electrode 220 and proof mass 216). During a first a quarter of the drive cycle, proof mass 216 may be driven along the y-axis in the negative direction until proof mass 216 reaches a point of maximal negative y-axis displacement. Because the area of overlap between proof mass 216 and electrode 220 is at a minimum when proof mass is maximally displaced in the negative y-axis direction, electrode 220 will measure a lowest capacitance. Proof mass 216 for the second quarter of the drive cycle may proceed from the point of maximal negative y-axis displacement to a point of zero y-axis displacement. Because a bottom surface of proof mass 216 once again overlaps completely with a top surface of electrode 220, electrode 220 will measure a maximum capacitance. As proof mass 216 finishes the third quarter of the drive cycle, proof mass 216 may reach the maximal displacement in the positive y-axis direction. Because an area of overlap between a bottom surface of proof mass 216 and a top surface of electrode 220 is at a minimum, electrode 220 will once again measure a minimum capacitance. As proof mass 216 completes the last quarter of the cycle by moving along the negative y-axis direction, proof mass 216 once again completely overlaps with electrode 220 and measures a maximum capacitance. Because the signal magnitude is proportional to capacitance and subsequently the z-distance, the signal can be used to detect change in gap.

As illustrated above, the resultant signal is two times the drive frequency. As discussed further below with respect to FIG. 5, a signal measured at electrode 220 due to the movement of proof mass 216 along the y-axis is added in the frequency domain with the signal resultant from external forces on proof mass 216 (e.g., rotational forces causing proof mass 216 to travel along the z-axis and thereby increasing or decreasing the capacitance measured by electrode 220 as the separation between proof mass 216 and electrode 220 increases or decreases). Because the signals are added in the frequency domain, techniques may be used to separate the signal at twice the drive frequency (e.g., due to the change in overlap from the y-axis drive motion) from the signal at the drive frequency (e.g., due to a Coriolis force which changes z-axis direction/polarity at the drive frequency). While sensor output 302 is shown in FIG. 3 varying as a result of the change in overlap between proof mass 216 with electrode 220, the amplitude of the sensor output is additionally proportional to the voltage applied to the proof mass, the integrated circuit (IC) gain and is inversely proportional to the gap between proof mass 216 and electrode 220. As the sensitivity of the measured Coriolis output (e.g., due to an external force applied to and measured by the MEMS gyroscope) is also a function of these parameters, such as capacitive gap and IC gain, sensor output 302 may be utilized by the exemplary MEMS gyroscope to calibrate sensitivity of the measured Coriolis force.

The movement of proof mass 216 along the y-axis with respect to electrode 220 and resultant signal measured by electrode 220 depicted in FIG. 3 is an exemplary embodiment where proof mass 216 is perfectly aligned with electrode 220 when proof mass 216 is not experiencing a drive force and where the drive force causes proof mass 216 to move an equal amount in the negative y-axis direction as it does in the positive y-axis direction. However, due to manufacturing tolerances, changes in temperature, wear on components over time, changes in capacitive gaps, etc. the abovementioned conditions may not always be met resulting in errors in the measurements from the sense channel of the MEMS sensor. It is preferable to extract a signal from electrode 220 that may be used by the MEMS sensor to calibrate the sensitivity of a transducer measuring the sensed force. Exemplary methods and systems are described herein that generate a test signal (e.g., a signal used to calibrate and/or correct measurement errors of the Coriolis force) based on the drive motion and associated overlap change of the proof mass (e.g., proof mass 216) and associated overlap change with a sense electrode (e.g., electrode 220). The signal generated by electrode 220 may be separable from the sum of the signals representing the movement of proof mass 216 along the y-axis, due to the drive force, (e.g., the test signal) and the movement of proof mass 216 along the z-axis, due to external forces such as a rotation of the gyroscope (e.g., the Coriolis force signal).

Figure 4A:
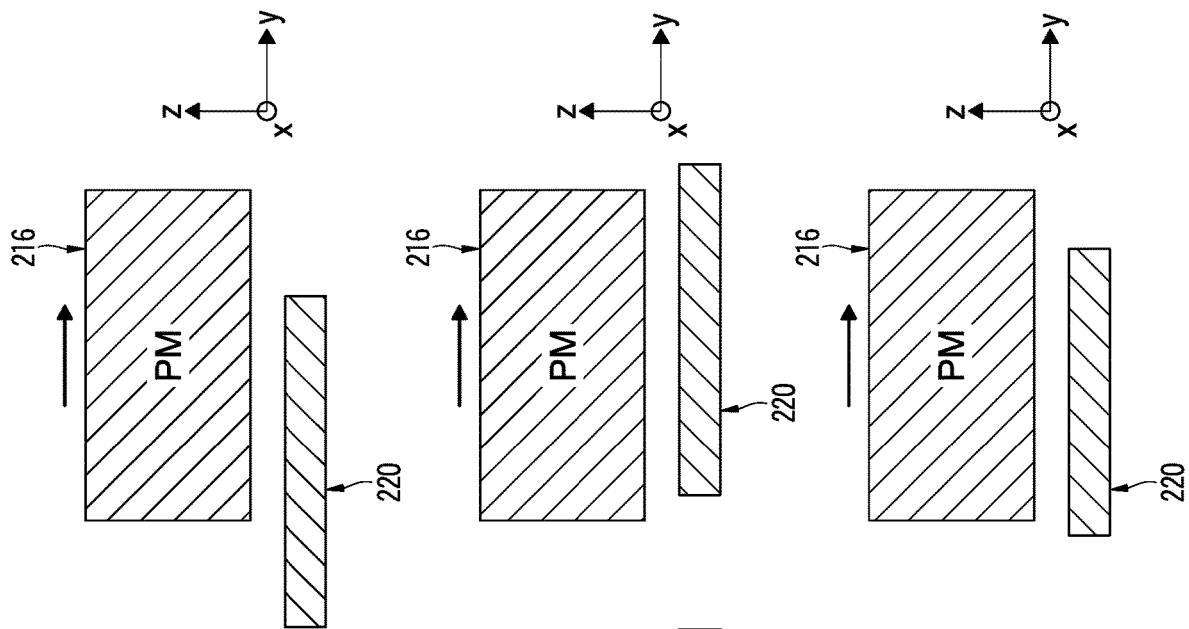
FIG. 4A shows an illustrative configuration of a proof mass and an electrode under a drive force in accordance with some embodiments of the present disclosure.

FIG. 4A depicts an illustrative configuration of a proof mass and an electrode experiencing a drive force in accordance with some embodiments of the present disclosure. Specifically, FIG. 4A illustrates an exemplary embodiment where proof mass 216 has a same size along the y-axis as does electrode 220. In FIG. 4A, proof mass 216 is depicted having zero misalignment with respect to electrode 220 (e.g., a middle of proof mass 216 aligns with a middle of electrode 220 along the y-axis direction when proof mass 216 is not experiencing a drive force). For example, similar to the exemplary configuration of proof mass 216 with respect to electrode 220 depicted in FIG. 3, proof mass 216 achieves maximal overlap with electrode 220 twice in the drive cycle (e.g., at a beginning of the drive cycle and in a middle of the drive cycle). The resultant capacitance signal measured by electrode 220 caused by the movement of proof mass 216 along the y-axis due to the drive force is twice the frequency of the drive force and is proportional to the position of proof mass 216 along the y-axis. Because the signal is added in the frequency domain with the signal caused by the movement of proof mass 216 in the z-axis direction due to external forces, the two signals may be separated and individually evaluated (e.g., to determine the test signal caused by the movement of proof mass 216 in the y-axis direction due to the drive force and to determine a Coriolis force signal caused by movement of proof mass 216 in the z-axis direction due to an external force).

Figure 4B:
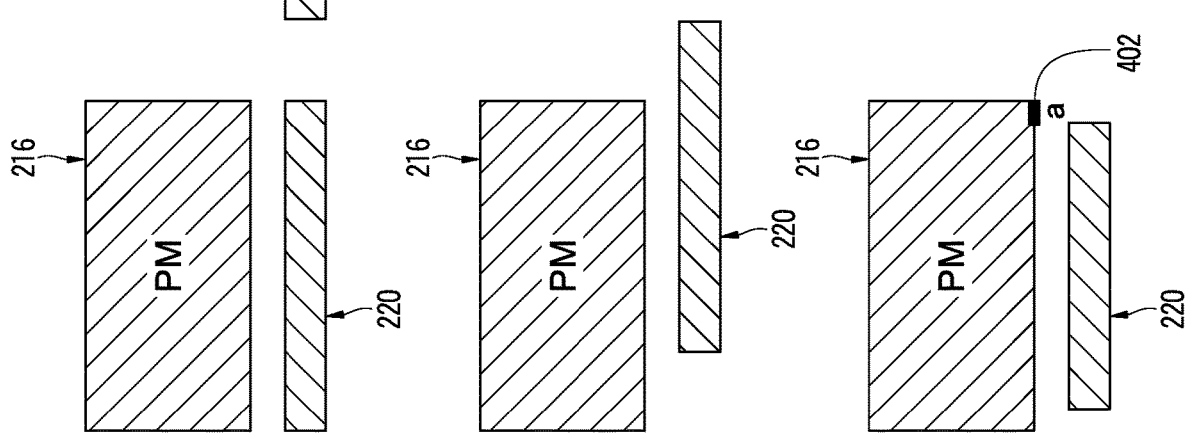
FIG. 4B shows an illustrative configuration of a misaligned proof mass and electrode under a drive force in accordance with some embodiments of the present disclosure.

However, as discussed above, perfect alignment of proof mass 216 with respect to electrode 220 is difficult to achieve due to manufacturing tolerances, changes in temperature, changes in physical properties of springs in the MEMS layer, etc. FIG. 4B depicts the resultant movement of proof mass 216 with respect to electrode 220 when there is a misalignment of proof mass 216 with respect to electrode 220 along the y-axis (e.g., due to a minimum manufacturing tolerance allowing proof mass 216 to be misaligned from electrode 220 where a middle of proof mass 216 does not align with a middle of electrode 220 along the y-axis direction). In the exemplary embodiment of FIG. 4B, when proof mass 216 is at a maximal displacement along the negative y-axis direction, due to the drive force, approximately half of proof mass 216 overlaps with electrode 220. As proof mass moves along the y-axis in the positive direction, proof mass 216 does not experience maximal overlap with electrode 220 until proof mass 216 reaches its maximal displacement along the y-axis in the positive direction. Because as proof mass moves from the point of greatest displacement in the negative y-axis direction to the point of greatest displacement in the positive y-axis direction the area of overlap between proof mass 216 only increases, electrode 220 will measure a capacitance signal that merely increases. Because the signal merely increases as proof mass 216 moves along the y-axis in the positive direction and decreases as proof mass 216 moves along the y-axis in the negative y-axis direction, the resultant signal caused by the movement of proof mass 216 along the y-axis is at the same frequency as the drive signal. Accordingly, because the signal caused by the movement of proof mass 216 along the y-axis and the signal cause by the movement of proof mass 216 along the z-axis are at the same frequency and are summed in the frequency domain, the signals cannot be separated as previously discussed. Accordingly, the misalignment of proof mass 216 will cause measurement errors as it is unclear what change in capacitance is attributable to the movement of proof mass 216 along the y-axis and what change in capacitance is attributable to the movement of proof mass 216 along the z-axis.

Figure 4C:
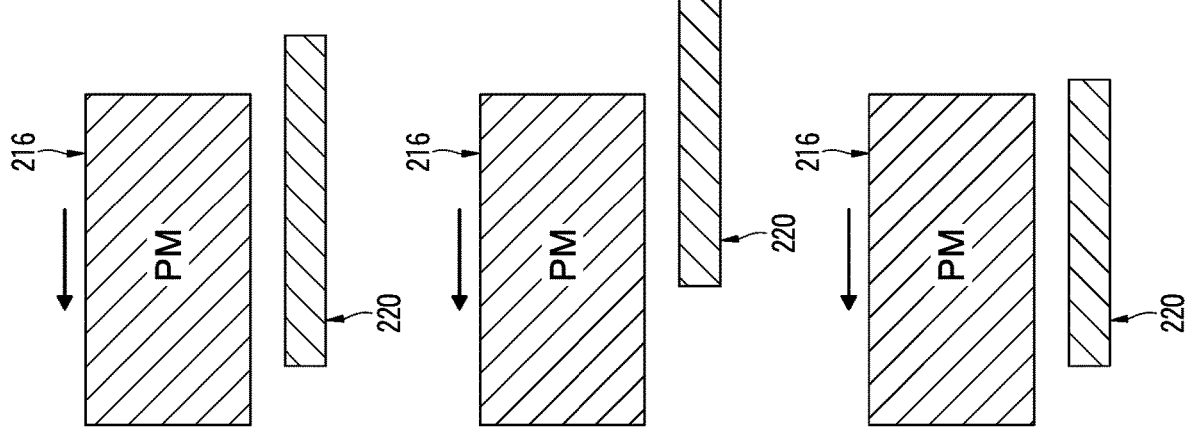
FIG. 4C shows an illustrative configuration of a proof mass and an electrode under a drive force having a tolerance for misalignment in accordance with some embodiments of the present disclosure.

FIG. 4C depicts an illustrative configuration of a proof mass and an electrode experiencing a drive force that is tolerant to misalignment, in accordance with some embodiments of the present disclosure. For example, FIG. 4C depicts proof mass 216 having a dimension along the y-axis that is greater than a dimension of electrode 220 along the y-axis. Although in the exemplary embodiment depicted in FIG. 4C proof mass 216 is not misaligned from electrode 220 (e.g., a middle of proof mass 216 aligns with a middle of electrode 220 along the y-axis direction), by decreasing the size of electrode 220, proof mass 216 may be misaligned by at most by distance 402, 'a' and will still result in an output signal that is twice that of the drive frequency, assuming that the drive amplitude is at least greater than a difference between misalignment distance and 'a'

For example, when proof mass 216 is not under a drive force, or is at a beginning, middle or end of a drive cycle, a middle of proof mass 216 is aligned with a middle of electrode 220 along the y-axis. As proof mass 216 moves in the negative y-axis direction, initially the overlap between proof mass 216 and electrode 220 is unchanged (e.g., a same area of overlap occurs as proof mass 216 is moving in the negative y-axis direction but before a rightmost edge of proof mass 216 passes a rightmost edge of electrode 220 along the y-axis). Because proof mass 216 is larger than electrode 220 by two times 'a' and because a center of proof mass 216 is aligned with a center of electrode 220 along the y-axis. Proof mass 216 may move at least 'a' distance along the y-axis in the negative direction before an area of overlap between proof mass 216 with respect to electrode 220 decreases. As the area of overlap decreases (e.g., as proof mass 216 moves along the y-axis direction a distance greater than 'a') an area of overlap between proof mass 216 and electrode 220 decreases, causing the capacitance measured by electrode 220 to decrease. As proof mass travels in the positive y-axis direction, from a position of greatest displacement along the y-axis in the negative direction, the capacitance will increase as the area of overlap between proof mass 216 and electrode 220 increases up until the rightmost edge of proof mass 216 passes the right most edge of electrode 220. As proof mass 216 continues to travel along the y-axis in the positive direction, a leftmost edge of proof mass 216 passes a leftmost edge of electrode 220, resulting in a decrease area of overlap, and therefore capacitance, between proof mass 216 and electrode 220.

By configuring proof mass 216 to be larger than electrode 220 by a value such as 2 times 'a', and maintaining that a difference between the misalignment and 'a' is less than the drive amplitude, a capacitance due to the change in overlap is measured by electrode 220 that has a period that is twice the frequency of the drive frequency. Because, as discussed above and below with respect to FIG. 5, the signal generated by electrode 220 from the movement of proof mass 216 along the y-axis is summed in the frequency domain with the signal generated by electrode 220 from the movement of proof mass 216 along the z-axis a signal due to the change in the y-axis displacement of proof mass 216 (e.g., test signal) can be separated from a signal due to the z-axis displacement of proof mass 216. Because the test signal generated due to the change in the y-axis displacement of proof mass 216 is also a function of the gap between the proof mass and the electrode, the exemplary gyroscope may use the test signal to calibrate the sensor.

Figure 5:
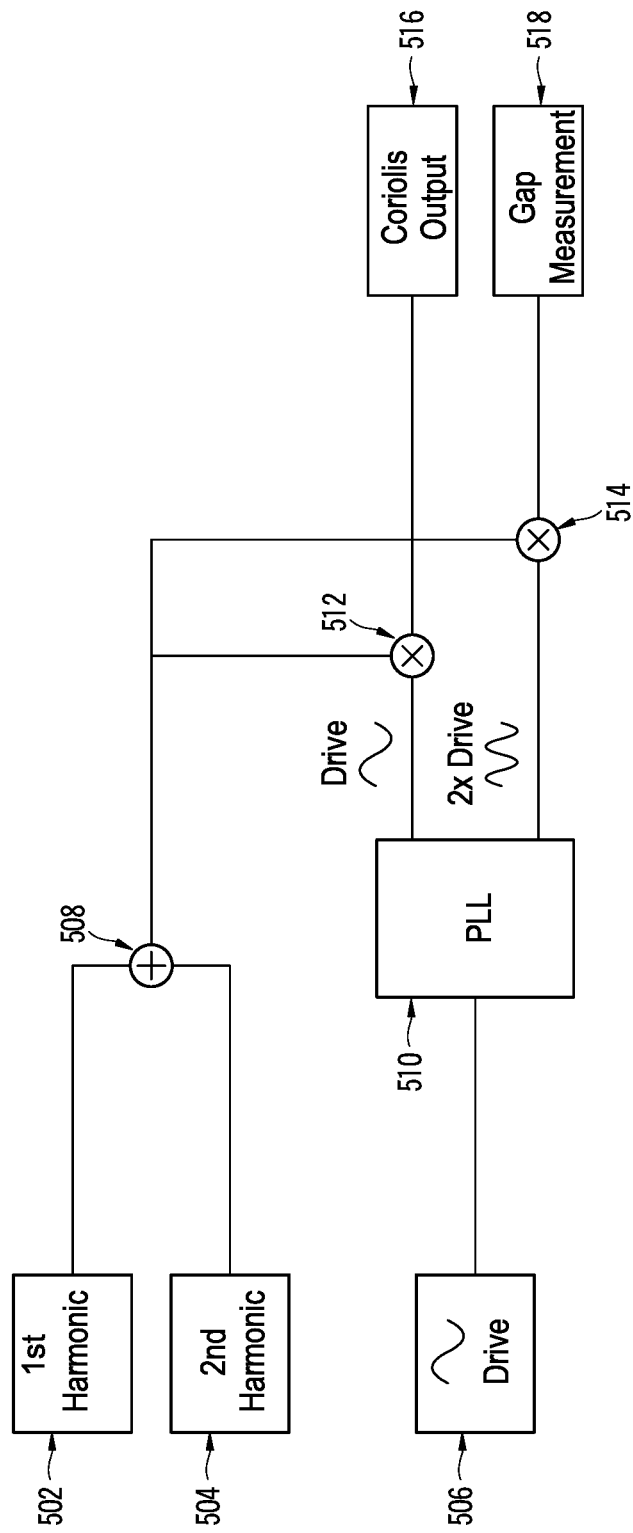
FIG. 5 shows an illustrative signal path in accordance with some embodiments of the present disclosure.

FIG. 5 shows an illustrative signal path in accordance with some embodiments of the present disclosure. The exemplary signal path of FIG. 5 depicts first harmonic 502 added to second harmonic 504 at addition node 508. For example, electrodes 220A, 220B, 220C, and/or 220D may output first harmonic signal 502 representing a capacitance measured by the electrode based on the movement of proof masses 216A, 216B, 216C, and/or 216D along the z-axis (e.g., in response to an external force such as a rotation of the exemplary gyroscope in FIG. 2). Electrodes 220A, 220B, 220C, and/or 220D may output second harmonic signal representing a capacitance measured by the electrode based on the movement of proof masses 216A, 216B, 216C, and/or 216D along the y-axis (e.g., in response to a drive force). A summing of first harmonic signal 502 and second harmonic signal 504 may occur at electrodes 220A, 220B, 220C, and/or 220D (e.g., because the signals are summed in the frequency domain based on a detected movement of a proof mass in both the y-axis and z-axis direction).

In an embodiment, the combined signal including both the drive signal and the harmonic signal may be demultiplexed, such that harmonic and drive signals may be analyzed separately. Although the signals may be demultiplexed in a variety of manners, in an exemplary embodiment a signal at the drive frequency and a signal at the harmonic frequency may be generated to extract the respective components from the combined signal. For example, a drive frequency 506 may be input into a PLL to demultiplex the signal output by addition node 508 (e.g., the signal output by electrodes 220A, 220B, 220C, and/or 220D). PLL 510 may output a drive signal and may output a signal having twice the frequency of the drive signal and may multiply those signals, in the frequency domain, at multiplication node 512 and multiplication node 514, respectively, with the signal output from addition node 508. The resultant output signal from multiplication node 512 is the Coriolis output (e.g., the signal at the drive frequency that corresponds to the movement of the proof masses 216A, 216B, 216C, and 216D along the z-axis) and the resultant output signal from multiplication node 514 is the gap measurement (e.g., the signal at twice the drive frequency that corresponds to the movement of the proof masses 216A, 216B, 216C, and 216D along the y-axis).

An amplitude of the signal corresponding to Coriolis output 516 (e.g., sensed capacitance) varies based on the change in distance between proof masses 216A, 216B, 216C, and 216D and electrodes 220A, 220B, 220C, and 220D along the z-axis in response to movement of the proof masses due to a Coriolis force (e.g., a Coriolis force in response to a rotation of the gyroscope). However, variations in the gap between the proof masses and the electrodes on the substrate layer (e.g., based on manufacturing tolerances, temperature, a variation in the gap due to physical changes of the MEMS components over time, etc.) may result in a shift in the baseline value (i.e., in the absence of Coriolis force) that causes an error in the measured result by the Coriolis output alone.

Gap measurement 518 may be utilized to estimate a gap between proof masses 216A, 216B, 216C, and 216D and electrodes 220A, 220B, 220C, and 220D, e.g., corresponding to the z-axis distance in the absence of a Coriolis force causing the proof masses to move along the z-axis. Values of the gap measurement signal are proportional to the degree of overlap and the z-axis distance between the proof masses and the electrodes (i.e., the gap). For example, the amplitude of the signal generated based on the change in overlap between the proof mass (e.g., proof masses 216A, 216B, 216C, and 216D) and the electrode (e.g., electrodes 220A, 220B, 220C, and 220D) may be approximated by the equations below where Amplitude is the amplitude of the signal generated based on the change in overlap, $V_{pm}$ is the voltage applied to the proof mass, $\Delta_{drive}$ is the change in drive amplitude of the proof mass, gap is the capacitive gap between the proof mass and the electrode, $K_{IC}$ is the integrated circuit gain of an amplifier associated with the exemplary MEMS gyroscope, and where W and L are the with and length of the surface of the electrode:

$$\text{Amplitude} \propto \frac{V_{pm} * \Delta_{drive} * K_{IC}}{\text{gap}} \text{ or}$$

$$\text{Amplitude} \propto \frac{\varepsilon_0 * W(L + \Delta_{drive})}{\text{gap}}$$

In this manner, this signal may be analyzed (e.g., based on raw values, rate of change of gap values, changes in gap values over time, etc.) in order to compensate for the change in gap in performing calculations of angular velocity. For example, the slope of the amplitude of the test signal (e.g., first derivative) is proportional to approximately the reciprocal of the gap measurement. Accordingly, the exemplary MEMS gyroscope may estimate the gap between the proof mass and the electrode and may compensate the sensor output to account for any irregularities based on the estimated gap measurement. Additionally, the test signal is dependent on sensor parameters, such as the voltage of the proof mass, the drive amplitude of the proof mass, and integrated circuit gain of the amplifier associated with the MEMS gyroscope. Accordingly, the test signal may be used by the MEMS gyroscope to estimate and track the above-mentioned sensor parameters and compensate the Coriolis force calculation as necessary. For example, compensation may be performed such as by modifying offsets and/or scaling factors in the calculation of the output angular velocity value.

The Coriolis force signal generated due to the out of plane movement of the proof mass (e.g., a Coriolis force in response to a rotation of the gyroscope) can be approximated using the equation below where amplitude is the Coriolis force signal, $V_{pm}$ is the voltage applied to the proof mass, $\Delta_{drive}$ is the change in drive amplitude of the proof mass, $\Delta_{force}$ is the change in distance between the proof mass and the electrode caused by a Coriolis force, gap is the capacitive gap between the proof mass and the electrode, $K_{IC}$ is the integrated circuit gain of an amplifier associated with the exemplary MEMS gyroscope, and where W and L are the with and length of the surface of the electrode:

$$\text{Amplitude} \propto \frac{V_{pm} \Delta_{drive} K_{IC}}{\text{gap}^2} \text{ or}$$

$$\text{Amplitude} \propto \frac{\varepsilon_0 * W * L}{\text{gap} + \Delta_{force}}$$

As the amplitude of the Coriolis output signal is proportional to approximately the reciprocal of the squared gap distance, the exemplary mems sensor may utilize the estimated gap value (e.g., derived based on the test signal) to scale or compensate for the Coriolis output signal. As the amplitude of the Coriolis output signal is proportional to additional parameters that may be estimated by the test signal, such as the proof mass voltage, IC gain, and drive amplitude, the exemplary MEMS gyroscope may utilize estimates of these additional parameters to modify the Coriolis force calculation.

Figure 6:
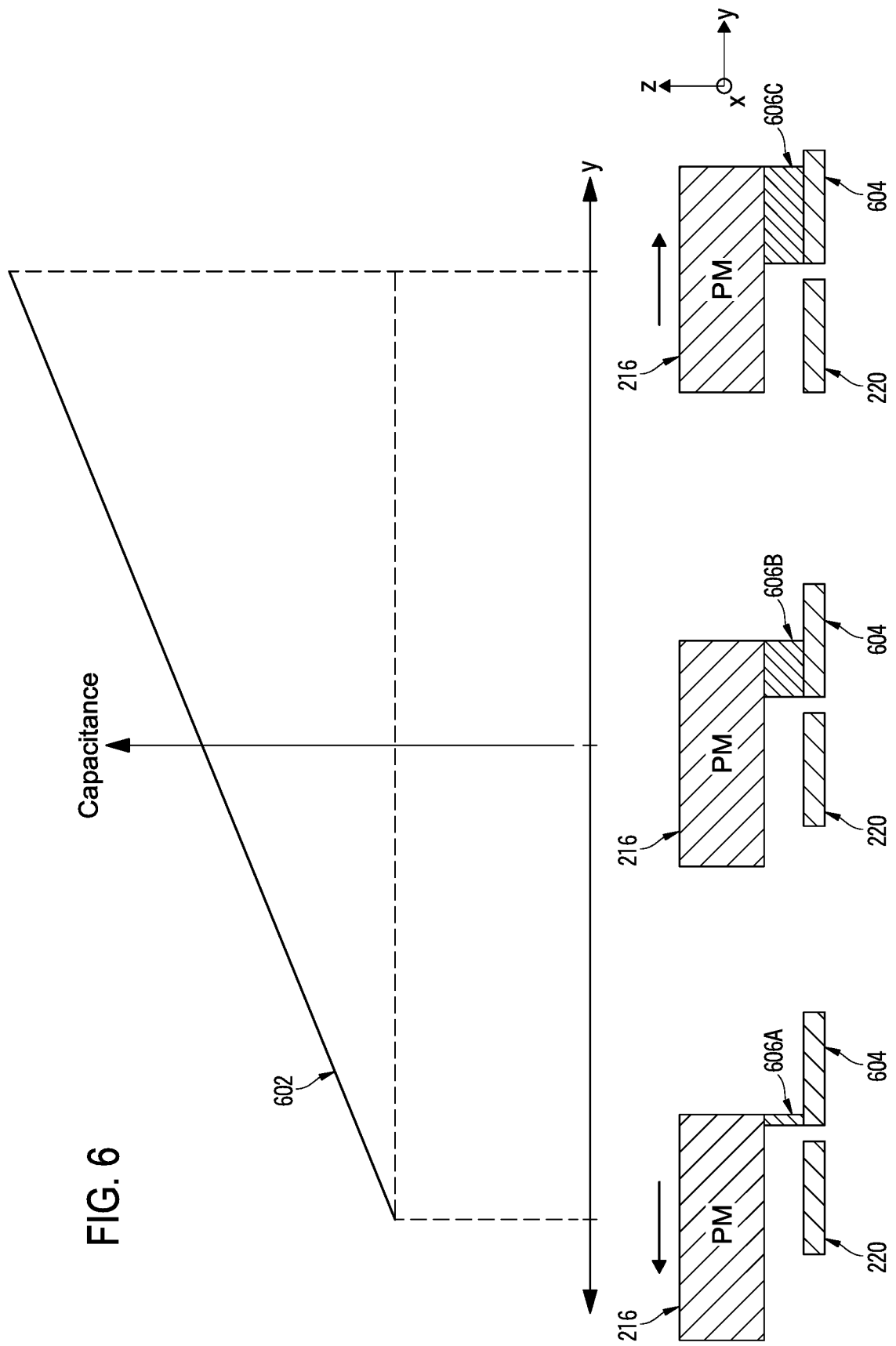
FIG. 6 shows an illustrative sensor output in accordance with some embodiments of the present disclosure.

FIG. 6 shows an illustrative sensor output in accordance with some embodiments of the present disclosure. In the exemplary embodiment of FIG. 6, a separate gap sense electrode is used to sense the change and overlap. The change in overlap may be used to determine a gap distance in the same manner as the gap measurement signal 518 in FIG. 5, e.g., to modify the operation of the sensor such as by modifying the Coriolis output 516. In FIG. 6 proof mass 216 overlaps with multiple electrodes, electrode 220 and gap sense or test electrode 604. In the embodiment depicted in FIG. 6, the capacitance depicted is associated with electrode 604, which is located and sized such that the overlap of the electrode 604 with the proof mass 216 has a maximum at one end of the drive motion (e.g., positive y-direction in FIG. 6) and a minimum in the other end of the drive motion (e.g., negative y-direction in FIG. 6). The electrode 220 may be located and sized relative to the proof mass 216 such that it has complete overlap with the proof mass 216 throughout the entire drive motion.

As proof mass 216 moves along the y-axis due to a drive force, the capacitance detected by electrode 604 varies linearly with respect to the position of proof mass 216 along the y-axis. For example, when proof mass 216 is in a position having greatest negative y-axis displacement, an area of overlap between proof mass 216 and electrode 604, as illustrated by region 606A, is at a minimum. Accordingly, the capacitance sensed by electrode 604 is at a minimum as depicted by signal output 602. As proof mass 216 travels along the y-axis in the positive direction, the overlap between proof mass 216 and electrode 604 will continually increase. For example, as depicted by region 606B, when proof mass 614 overlaps half way with electrode 604, electrode 604 will detect a capacitance value that is proportional to the overlap (e.g., greater than the capacitance when proof mass 604 is at the greatest negative y-axis position but less than the capacitance when proof mass 604 is at the greatest positive y-axis position). As proof mass 604 travels along the y-axis to a position of greatest positive y-axis displacement, proof mass 216 maximally overlaps with electrode 604, as illustrated by region 606C, causing electrode 604 to output signal 602 at its greatest capacitance value. Based on the above it is apparent that signal output 602 is at the same frequency of the drive frequency. Because the signal output by electrode 604 (e.g., the signal indicative of the movement of proof mass 216 along the y-axis direction) is separate from the signal output from electrode 220 (e.g., the signal indicative of movement of proof mass 216 along the z-axis direction) signal 602 may be utilized to approximate the gap of proof mass 216 without the need for demultiplexing the signal (e.g., as illustrated in FIG. 5). The amplitude of signal 602, like the test signal discussed in relation to FIG. 5 is proportional to $$\frac{V_{pm} * \Delta_{drive} * K_{IC}}{\text{gap}}$$

or alternatively $$\frac{\varepsilon_0 * W(L + \Delta_{drive})}{gap}.$$

Accordingly, signal 602 may be used by an exemplary MEMS gyroscope to approximate sensor parameters such as the gap between the proof mass and the electrode, the voltage of the proof mass, the drive amplitude of the proof mass, and integrated circuit gain, and may utilize estimates of these parameters to modify a calculation of the force (e.g., by modifying offsets and/or scaling factors in the calculation of the output angular velocity value).

In some embodiments, an exemplary gyroscope comprising the configuration of proof mass 216 and electrodes 220 and 604 may perform a calibration at certain times (e.g., periodically, during startup, etc.) to measure the gap between proof mass 216 and the substrate (e.g., including electrode 604) and may not utilize the signal from electrode 604 during sensing. For example, at certain times the exemplary gyroscope may analyze signal 602 output by electrode 604 and may, based on signal 602, adjust a parameter associated with electrode 220. For example, if the exemplary gyroscope may apply a drive force on proof mass 216 to cause proof mass 216 to move back and forth along the y-axis. The exemplary gyroscope may determine, for example, based on signal 602, that the gap between the proof mass 216 and the substrate is off from a desired gap or has changed during operation. Based on this determination, the exemplary gyroscope may, for example, scale an output from electrode 220 (e.g., the Coriolis output) to account for the measured gap (e.g., based on a scaling function that varies with respect to the y-position of proof mass 216).

In some embodiments, electrode 604 may be located on the substrate layer at a distance such that proof mass 216 does not overlap with electrode 604 during normal operation of the exemplary gyroscope (e.g., because a drive amplitude is not sufficiently strong to cause proof mass 216 to move along the y-axis and overlap with electrode 604. For example, the exemplary gyroscope may apply a larger test drive force on proof mass 216 to perform a calibration routine such that the additional drive force causes proof mass 216 to travel along the y-axis and overlap with electrode 604. The exemplary gyroscope may, during normal sensing operation, drive proof mass 216 with a lessor drive force such that proof mass 216 does not necessarily overlap with electrode 604.

Although the present disclosure has described, for example, utilizing the change in overlap to derive a signal associated with a gap between a proof mass and electrode or a change in such a gap, for purposes of modifying a sensed force such as Coriolis force, it will be understood that such a signal may be used for other purposes. In an exemplary embodiment, an overlap or gap signal may be used to modify operational parameters such as drive force, drive frequency, applied voltages, and other suitable values. In some embodiments, alarms, warnings, notifications, and/or operational modes may be modified based on the overlap or gap signal. In some embodiments, changes in the gap signal may be used to indicate a useful life of the MEMS sensor, or utilized in weightings or calculations involving combined sensor values (e.g., sensor fusion).

The foregoing description includes exemplary embodiments in accordance with the present disclosure. These examples are provided for purposes of illustration only, and not for purposes of limitation. It will be understood that the present disclosure may be implemented in forms different from those explicitly described and depicted herein and that various modifications, optimizations, and variations may be implemented by a person of ordinary skill in the present art, consistent with the following claims.

It will be understood that the configurations of masses, springs, levers, anchoring portions, electrodes, and similar components are exemplary only and that various configurations from multiple figures may be combined in suitable manners. It will further be understood that other suitable modifications, additions, removals, optimizations, or variations may be implemented by a person having ordinary skill in the art or as is described herein.

What is claimed is:

1. A microelectromechanical (MEMS) sensor for measuring a force, comprising:
   a proof mass located within a MEMS layer of the MEMS sensor and comprising a proof mass planar surface;
   an electrode comprising an electrode planar surface to form a first capacitor with the proof mass, wherein the electrode planar surface faces the proof mass planar surface to form the first capacitor, wherein the proof mass is caused to oscillate according to a drive motion, and wherein an overlap of facing portions of the electrode planar surface and the proof mass planar surface changes during the drive motion;
   processing circuitry configured to receive a sense signal from the first capacitor, measure a magnitude of a signal generated due to a change in the overlap based on the sense signal, and modify a calculation of the force based on the magnitude of the signal generated due to the change in the overlap, wherein the processing circuitry is further configured to determine a force signal and an overlap signal from the sense signal, wherein the measured magnitude of the sense signal generated due to the change in overlap is based on the overlap signal, and wherein the force signal is based on a change in a distance between the proof mass and the electrode.

2. The MEMS sensor of claim 1, wherein the drive motion comprises a resting drive position, a first drive displacement associated with a first direction relative to the resting drive position, and a second drive displacement associated with a second direction relative to the resting drive position.

3. The MEMS sensor of claim 2, wherein the first drive displacement is an opposite direction than the second drive displacement.

4. The MEMS sensor of claim 2, wherein the sense signal associated with the resting drive position is greater than the sense signal associated with the first drive displacement and the sense signal associated with second drive displacement.

5. The MEMS sensor of claim 2, wherein the sense signal associated with the resting drive position is less than the sense signal associated with the first drive displacement and the sense signal associated with second drive displacement.

6. The MEMS sensor of claim 2, wherein the sense signal associated with the resting drive position is greater than the sense signal associated with the first drive displacement and less than the sense signal associated with second drive displacement.

7. The MEMS sensor of claim 1, wherein the MEMS sensor comprises a gyroscope, and wherein the proof mass moves in a sense direction in response to the force, and wherein the sense direction is orthogonal to the drive motion.

8. The MEMS sensor of claim 1, wherein the proof mass is oscillated at a drive frequency, wherein a frequency of the force signal corresponds to the drive frequency, and wherein a frequency of the overlap signal corresponds to an integer multiple of the drive frequency.

9. The MEMS sensor of claim 1, wherein the processing circuitry is configured to determine the force signal based on a demodulation of the sense signal at the drive frequency and to determine the overlap signal based on a demodulation of the sense signal at the integer multiple of the drive frequency.

10. The MEMS sensor of claim 1, further comprising a second electrode comprising a second electrode planar surface to form a second capacitor with the proof mass, wherein a capacitance of the second capacitor changes in response to the force, wherein a force signal is based on the second capacitor, and wherein the calculation of the force is based on the force signal.

11. The MEMS sensor of claim 1, wherein the electrode planar surface is parallel to the proof mass planar surface.

12. The MEMS sensor of claim 1, wherein a displacement of the proof mass in response to the force is normal to the electrode planar surface.

13. The MEMS sensor of claim 12, wherein the drive motion is parallel to the electrode planar surface.

14. The MEMS sensor of claim 2, wherein the processing circuitry is configured to estimate at least one of the first drive displacement, the second drive displacement, a proof mass voltage, a capacitive gap, and a circuit gain based on the signal generated due to the change in the overlap.

15. The MEMS sensor of claim 14, and wherein the processing circuitry is further configured to modify the calculation of the force based on the estimated at least one of the first drive displacement, the second drive displacement, the proof mass voltage, the capacitive gap, and the circuit gain.

16. The MEMS sensor of claim 1, wherein the processing circuitry is configured to estimate a capacitive gap for the first capacitor based on the signal generated due to the change in overlap.

17. The MEMS sensor of claim 16, wherein the processing circuitry is further configured to modify the calculation of the force based on the estimated capacitive gap.

18. A microelectromechanical (MEMS) gyroscope, comprising:
a substrate layer, wherein the substrate layer comprises an electrode on an upper surface of the substrate layer;
a MEMS layer, wherein the MEMS layer comprises a proof mass, wherein a lower surface of the proof mass faces the electrode to form a capacitor, wherein the proof mass is caused to oscillate according to a drive motion, and wherein an overlap of facing portions of the electrode and the proof mass changes during the drive motion; and
processing circuitry configured to receive a sense signal from the capacitor, measure a magnitude of the sense signal generated due to a change in the overlap based on the sense signal, receive a force signal based on a movement of the proof mass orthogonal to the drive motion, and calculate a force based on the force signal and the magnitude of the signal generated due to the change in the overlap, wherein the processing circuitry is further configured to determine a force signal and an overlap signal from the sense signal, wherein the measured magnitude of the sense signal generated due to the change in overlap is based on the overlap signal, and wherein the force signal is based on a change in a distance between the proof mass and the electrode.

19. A method for a microelectromechanical (MEMS) sensor to determine a force, comprising:
causing a proof mass to oscillate according to a drive motion, wherein the proof mass located within a MEMS layer of the MEMS sensor and comprises a proof mass planar surface, wherein an electrode comprising an electrode planar surface faces the proof mass planar surface to form a first capacitor, and wherein an overlap of facing portions of the electrode planar surface and the proof mass planar surface changes during the drive motion;
receiving a sense signal from the first capacitor;
measuring a magnitude of the sense signal generated due to a change in the overlap based on the sense signal;
modifying a calculation of the force based on the magnitude of the signal generated due to the change in the overlap; and
determining a force signal and an overlap signal from the sense signal, wherein the measured magnitude of the sense signal generated due to the change in overlap is based on the overlap signal, and wherein the force signal is based on a change in a distance between the proof mass and the electrode.

* * * * *